(12) United States Patent　(10) Patent No.: US 8,971,446 B2
Muhammad　(45) Date of Patent: Mar. 3, 2015

(54) PREDISTORTION FACTOR DETERMINATION FOR PREDISTORTION IN POWER AMPLIFIERS

(71) Applicant: MStar Semiconductor, Inc., Hsinchu Hsien (TW)

(72) Inventor: Khurram Muhammad, Garland, TX (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/947,315

(22) Filed: Jul. 22, 2013

(65) Prior Publication Data

US 2015/0023451 A1　Jan. 22, 2015

(51) Int. Cl.
*H04K 1/02*　(2006.01)
*H04B 1/74*　(2006.01)
*H04B 1/04*　(2006.01)

(52) U.S. Cl.
CPC ................ *H04B 1/74* (2013.01); *H04B 1/0475* (2013.01); *H04B 2001/0425* (2013.01)
USPC ............................ 375/297; 375/296; 375/300

(58) Field of Classification Search
USPC .......................................... 375/297, 296, 300
See application file for complete search history.

(56) References Cited

U.S. PATENT DOCUMENTS 7,058,369 B1 * 6/2006 Wright et al. .............. 455/114.2

OTHER PUBLICATIONS

Presti et al., "A 25 dBm Digitally Modulated CMOS Power Amplifier for WCDMA/EDGE/OFDM With Adaptive Digital Predistortion and Efficient Power Control", IEEE Journal of Solid-State Circuits, vol. 44, No. 7, Jul. 2009, pp. 1883-1896.
Kwon et al., "Digitally Equalized CMOS Transmitter Front-End With Integrated Power Amplifier", IEEE Journal of Solid-State Circuits, vol. 45, No. 8, Aug. 2010, pp. 1602-1614.
Elahi et al., "I/Q Mismatch Compensation Using Adaptive Decorrelation in a Low-IF Receiver in 90-nm CMOS Process", IEEE Journal of Solid-State Circuits, vol. 41, No. 2, Feb. 2006, pp. 395-404.
Mehta et al., "An Efficient Linearization Scheme for a Digital Polar EDGE Transmitter", IEEE Transactions on Circuits and Systems-II: Express Briefs, vol. 57, No. 3, Mar. 2010, pp. 193-197.
Chang et al., "A CMOS Transceiver with internal PA and Digital Pre-distortion for WLAN 802.11a/b/g/n Applications", IEEE Radio Frequency Integrated Circuits Symposium, 2010, pp. 435-438.

* cited by examiner

*Primary Examiner* — Kabir A Timory
(74) *Attorney, Agent, or Firm* — Edell, Shapiro & Finnan, LLC

(57) ABSTRACT

A baseband signal is generated as a sequence of complex sample values at a predetermined sample rate. A sample of the baseband signal is captured as is a sample of an output signal generated by a power amplifier from the captured sample of the baseband signal. Complex values are iteratively assigned to a complex factor intended for predistorting data such that the product of the baseband signal sample and the complex factor converges towards equivalence with the output signal sample with each iterative assignment of the complex values to the complex factor. The complex factor is stored in memory at an address associated with the value of the captured baseband signal sample.

20 Claims, 6 Drawing Sheets

PREDISTORTION FACTOR DETERMINATION FOR PREDISTORTION IN POWER AMPLIFIERS

TECHNICAL FIELD

The present disclosure relates to determining values for predistortion factors that when applied to data bound for a power amplifier compensates for distortion in that power amplifier.

BACKGROUND

Linearity and efficiency are competing design factors in modern radio frequency (RF) power amplifiers; linearity is required to prevent symbol, constellation and/or frequency spectrum corruption and efficiency results in less power consumption, which is particularly significant in battery operated devices. Unfortunately, linearity and efficiency are mutually exclusive in RF power amplifiers, i.e., efficiency is greatest at operating points of the power amplifier where the amplifier input/output relationship is the least linear. Predistortion is one of several techniques by which a balance is struck between linearity and efficiency.

The complex gain $G_D$ of a power amplifier may be quantified by the ratio of the output signal of the power amplifier Y by the input signal X provided to the power amplifier, e.g., $$G_D = \frac{Y}{X} = \frac{Y_{Re} + jY_{Im}}{X_{Re} + jX_{Im}} = A_D e^{j\theta_D} = G_{Re} + jG_{Im}, \quad (1)$$

where $A_D$ is amplitude distortion and $\theta_D$ is phase distortion. Computing this ratio is required repeatedly in predistortion calibration in that $A_D$ and $\theta_D$ are data dependent (or, more aptly, output power dependent, but output power is a typically a function of the input data). With advances in technology toward more robust calibration solutions, circuitry that implements a complex divider that computes the ratio in Eq. (1) is incorporated on devices in which the power amplifier is installed. Accordingly, ongoing research and development efforts seek ever greater reductions in resource consumption for such complex division.

One conventional complex division technique implements a change of coordinate system from Cartesian to polar, followed by division and subtraction operations, followed by a return to Cartesian coordinates, (since a vast majority of radio circuits process data in separate in-phase (I) and quadrature (Q) channels for real and imaginary parts, respectively, of the complex signal). Mathematically, such division proceeds as follows:

$$G_D = \frac{Y_{Re} + jY_{Im}}{X_{Re} + jX_{Im}} = \frac{|Y|e^{j\theta_Y}}{|X|e^{j\theta_X}} = \frac{|Y|}{|X|}e^{j(\theta_Y - \theta_X)} = G_{Re} + jG_{Im}. \quad (2)$$

The most apparent disadvantage of this approach is the requirement of the change in coordinates, which is typically carried out by a coordinate rotation digital computer (CORDIC) or similar technique.

Another conventional complex division technique multiplies the numerator and denominator of the ratio by the complex conjugate of the denominator followed by a complex multiplication operation and a real division operation, e.g., $$G_D = \frac{Y_{Re} + jY_{Im}}{X_{Re} + jX_{Im}} \cdot \frac{X_{Re} - jX_{Im}}{X_{Re} - jX_{Im}} = \frac{(Y_{Re} + jY_{Im})(X_{Re} - jX_{Im})}{X_{Re}^2 + X_{Im}^2} = G_{Re} + jG_{Im}. \quad (3)$$

This technique also requires a data conversion, i.e., conversion of the denominator from a complex value to a real value, in order to obtain the solution. Thus, both of these techniques require resources for data conversion in the computation, as well as a division operation, which is among the most resource intensive mathematical operations performed by a machine.

Given the state of the current art, the need is apparent for computing complex division for complex gain calculation that avoids preliminary or preparatory data conversion operations as well as the division operation itself.

SUMMARY

In a radio utilizing a radio frequency (RF) power amplifier, a baseband signal is generated as a sequence of complex sample values at a predetermined sample rate. For purposes of predistortion calibration, a sample of the baseband signal is captured, as well as a sample of an output signal that was generated by a power amplifier from the captured sample of the baseband signal. A complex factor intended for predistorting data is iteratively assigned complex values in a manner by which the product of the baseband signal sample and the complex factor converges towards equivalence with the output signal sample with each iterative assignment of the complex values to the complex factor. The complex factor is stored in memory at an address associated with the value of the captured baseband signal sample.

DESCRIPTION OF EXAMPLE EMBODIMENTS

Figure 1:
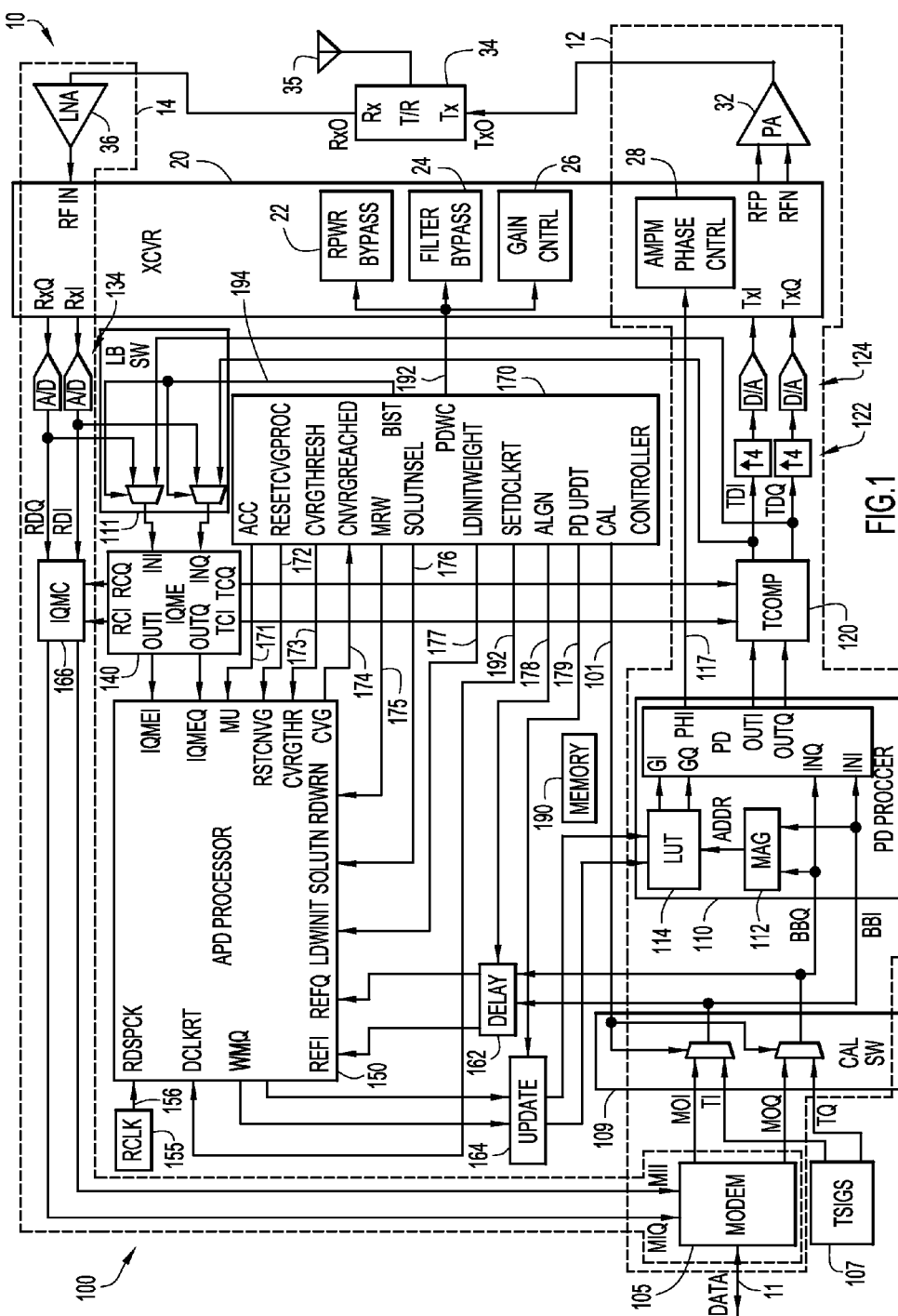
FIG. 1 is a schematic block diagram of a communication device in which the present general inventive concept may be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments Mathematical expressions are contained herein and those principles conveyed thereby are to be taken as being thoroughly described therewith. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

The figures described herein include schematic block diagrams illustrating various interoperating functional modules. Such diagrams are not intended to serve as electrical schematics and interconnections illustrated are intended to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

The techniques described herein are directed to computing complex factors that quantify a ratio between two complex numbers. As used herein, such complex factors include complex gain $G_D$, which is the ratio of the amplifier output to its input, and complex predistortion weights w, which is the inverse of the complex gain $G_D$, or the ratio of the input to the power amplifier to its output. The exemplary embodiments described herein are directed to wireless local area network (WLAN) applications, although the present invention is not so limited. Upon review of this disclosure and appreciation of the concepts disclosed herein, the ordinarily skilled artisan will recognize other distortion compensation contexts in which the present inventive concept can be applied. The scope of the present invention is intended to encompass all such alternative implementations.

FIG. 1 is a schematic block diagram of an exemplary communication device 10, such as a wireless communication device compliant with Institute of Electrical and Electronics Engineers (IEEE) 802.11 family of WLAN communication standards. As is typical for such devices, a data signal 11 is processed over a transmitter circuit path 12 for transmission and received data are processed over receiver circuit path 14 back into data signal 11. Such processing may be achieved by a digital front end (DFE) 100, a transceiver circuit 20, a transmitter power amplifier 32, a transmit/receive (T/R) switch 34, a receiver low noise amplifier (LNA) 36 and one or more antennas 35 coupled to T/R switch 34 to radiate and intercept radio frequency (RF) electromagnetic radiation by which communication with other such devices is achieved. In certain embodiments, all of the circuitry illustrated in FIG. 1 is assembled onto a common platform or into a common enclosure, including transportable platforms and enclosures such as in laptop or tablet computers and smartphones, to name but just a few.

In typical communications scenarios, data signal 11 is provided to modulator/demodulator (MODEM) 105, by which data signal 11 is transformed or otherwise formatted into a signal MO=MOI+jMOQ, where MOI is an in-phase (I) component of the signal and MOQ is a quadrature component of the signal. Signal MO is selectively provided through calibration switch 109 as baseband signal BB=BBI+jBBQ to predistortion (PD) processor 110. Baseband signal BB is predistorted by PD processor 110, as described in more detail below, and subsequently processed by compensation processor 120, which is described further below. The compensated signal TD=TDI+jTDQ, may be upsampled by upsamplers 122, converted to an analog signal by digital-to-analog (D/A) converters 124 and provided to transceiver 20. Transceiver 20 converts the analog baseband signal Tx=TxI+jTxQ into an analog RF signal, which may be provided to power amplifier 32 as a differential signal comprising signal components RFP and RFN. The differential RF signal is amplified by power amplifier 32 and provided to antenna 35 through T/R switch 34.

Electromagnetic radiation intercepted by antenna 35 is converted into an electrical signal, which traverses T/R switch 34 and is amplified by LNA 36. Transceiver 20 downconverts the received RF signal to a quadrature analog baseband signal Rx=RxI+jRxQ and subsequently into a digital signal RD=RDI+jRDQ. Received signal RD may be compensated for IQ mismatch in the receiver circuit path 14 by IQMC processor 166 and the compensated signal MI=MII+jMIQ may be demodulated into data signal 11 by MODEM 105.

DFE 100 comprises circuitry to implement not only communications mechanisms, but support circuitry as well, such as to perform calibration of various compensation processes performed in transmitter circuit path 12 and receiver circuit path 14. Central to communication device 10 is a controller 170, which implements functionality to, among other things, coordinate processes performed by various subsystems and components in communication device 10. Controller 170 may be realized by numerous control and processing platforms, including fixed and programmable logic circuits such as field programmable gate arrays, application specific integrated circuits, microcontrollers, microprocessors, digital signal processors, to name but just a few. Additionally, controller 170 may be constructed to perform various tasks through execution of suitably programmed processor instructions stored in memory system 190. Various functions performed by and signals generated by controller 170 will be described below in the context in which individual functions and signals are relevant.

Memory system 190 in FIG. 1 represents the combined storage facilities for both data and code across communication device 10; individual memory circuits, partitions, etc., separately referred to herein are to be considered a part of memory system 190. The present invention is not limited to a particular storage mechanism; memory 210 may be implemented in one or more volatile and persistent memory devices, including random access semiconductor memory, read-only memory, magnetic and/or optical media memory, flash memory and so on.

Communication device 10 may undergo one or more calibration procedures by which compensation for system-wide variability can be ameliorated. Compensation processor 120 may be calibrated and provided with compensation data to correct or prevent rotation, offset, skewing, and compression of data due to transmitter variability, such as IQ mismatch, local oscillator (LO) feed-through (LOFT) and signal droop. IQ mismatch in receiver circuit path 14 may be compensated for by IQ mismatch correction (IQMC) processor 166. IQMC in compensation processor 120 and IQMC processor 166 may be achieved through applying corrective data obtained by way of a calibration procedure performed by IQ mismatch estimation (IQME) processor 140. The present invention is not limited to particular techniques by which IQME, LOFT compensation, DC offset correction, droop compensation filtering (DCF), etc., are achieved. However, predistortion calibration, to which this disclosure is primarily devoted, may rely on such compensation, as will be understood and appreciated from explanations below.

Predistortion (PD) processor 110 may comprise a magnitude computation unit 112, a lookup table (LUT) 114 and a predistorter 116, although the present invention is not limited to a particular technique by which predistortion is applied. In certain embodiments, magnitude computation unit 112 computes the magnitude of baseband signal BB provided thereto, e.g., $|BB|=\sqrt{BBI^2+BBQ^2}$ and, from the computed magnitude, may determine an index into LUT 114 at which a corresponding predistortion weight w may reside. The predistortion weight w may be provided to predistorter 116, which may multiply samples of baseband signal BB by the corresponding weights w to predistort the baseband signal BB inversely to the corresponding complex gain $G_D$ at the power level demanded by that sample of baseband signal BB. In certain embodiments, LUT 114 contains amplitude modulation to amplitude modulation (AMAM) predistortion data, which are applied directly to samples of baseband signal BB, such as by complex multiplication. Amplitude modulation to phase modulation (AMPM) distortion may be ameliorated by a phase control signal 117 generated by PD processor 110 and subsequently provided to an AMPM phase control process 28 in transceiver 20, such as described in application Ser. No. 13/668,470 entitled, "Digital Frequency Modulation Aided AMPM Predistortion Digital Transmitter," commonly owned and co-pending with the instant application and incorporated by reference in its entirety as if fully set forth herein. Alternatively, phase distortion compensation may be applied directly on the baseband signal BB by predistorter 116 based on complex predistortion weights in LUT 114.

In certain embodiments, interpolation is used to determine weight values that fall between weight values in LUT 114. In one technique, an address generated from IBBI is split into two parts: consecutive 5 MSBs of the address are used to locate the computed weight in LUT 114, while the remaining LSBs are used to determine a final weight value interpolated from the computed weight. The final interpolated weight may be applied to baseband data BB by predistorter 116.

The distortion imparted by power amplifier 32, as characterized by a deviation of complex gain $G_D$ from linearity, and weights w for linearizing that distortion may be determined by a calibration process performed by adaptive predistortion (APD) processor 150. Once such weights w have been determined for all applicable input values, they may be stored in LUT 114 by, for example, update processor 164 under command of controller 170 through PDUPDT signal 179. In other embodiments, LUT 114 may be under at least partial control of ADP processor 150 so as to be updated as part of the calibration process, without transfer mechanisms of update processor 164.

As stated above, distortion caused by power amplifier 32 may be characterized by the deviation from linearity of the complex gain $G_D$, $$G_D(k) = \frac{Y(k)}{X(k)}, \quad (4)$$

where Y(k) is the $k^{th}$ sample of the output of power amplifier 32 for a given X(k) input. That is, under distortion of the power amplifier, Y(k) does not follow X(k) linearly, e.g., Y(k)·GX(k), where G is a desired constant gain. Instead, $$Y(k)=G_D(k)X(k)=A(k)e^{j\theta(k)}X, \quad (5)$$

where A(k) is an amplitude distortion factor corresponding to the $k^{th}$ sample of X and θ(k) is phase distortion corresponding to the $k^{th}$ sample of X that is also a function of the power output or magnitude of X. From Eq. (5), it will be recognized and appreciated that solving for $G_D$ in, $$Y-G_D X=0, \quad (6)$$

is equivalent to solving for $G_D$ by direct complex division, such as by the techniques discussed above in the Background section. In embodiments of the present invention, solution of Eq. (6) for $G_D$ is an estimation, e.g., $\hat{G}_D=G_D+e$, where e is an error term, and $$\lim_{e\to 0}[Y-(\hat{G}_D-e)X]=Y-G_D X=0, \quad (7)$$

which, as stated above, is equivalent to the result obtained by direct complex division. Thus, by iteratively forcing the error e to zero, at least to within some convergence threshold value, the result of complex division is obtained. Accordingly, the term "complex division" may be used herein for techniques (and "complex divider" for system components) that, while not performing direct complex division, achieves in the same result to within a margin of error.

Figure 2:
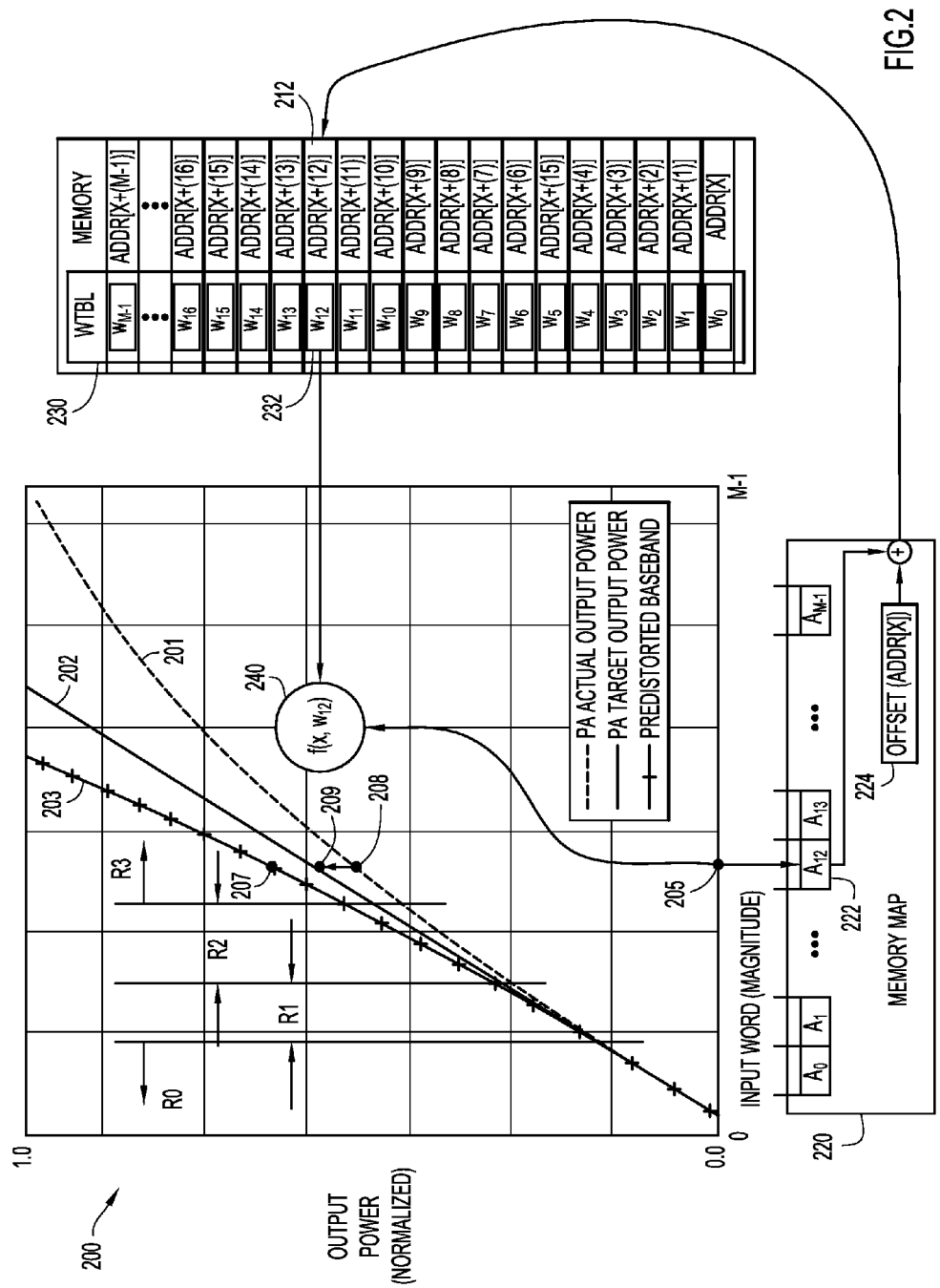
FIG. 2 is a diagram illustrating aspects of predistortion in context of the present general inventive concept.

FIG. 2 is a diagram depicting aspects of an exemplary predistortion technique that can be implemented in PD processor 110. Graph 200 defines a representational input/output space for transmitter circuit path 12; the abscissa of graph 200 is the magnitude of samples of baseband signal $|BB|=\sqrt{BBI^2+BBQ^2}$ and the ordinate is the normalized output power of power amplifier 32. In the presently described embodiment, the output power of power amplifier 32 follows the illustrated PA actual output curve 201 and predistortion weights $\{w_0, \ldots, w_{M-1}\}$ are computed to linearize the power amplifier output to the illustrated PA target output curve 202. To that end, embodiments of the present invention provide the predistortion weights $\{w_0, \ldots, w_{M-1}\}$ to predistort the input signal inversely to the gain $G_D$ of power amplifier 32 ($G_D$ follows PA actual output curve 201), representatively illustrated by predistorted input curve 203.

In certain embodiments, the dynamic range of power amplifier 32 is partitioned into M regions for each of which a weight $w_m$, m=0, 1, ..., M−1, is assigned. That is, M weights $w_m$ are determined for $2^N$ magnitude values. M may be chosen in accordance with a particular application, but is typically much smaller than $2^N$. For example, M may be 32, while N may be 10, and 32 different weights $w_m$ are determined and stored for 1024 different values of the magnitude of X(k). In this example, then, a single weight $w_m$ spans 32 adjacent or contiguous magnitude values.

Certain embodiments of the present invention allocate memory for a weight table 230 so that the entire dynamic range of power amplifier 32 is encompassed by the weights $\{w_0 \ldots w_{m-1}\}$. During the predistortion weight calibration procedure, the weights $w_m$ in weight table 230 may be computed, as described below, and when the computations for all weights $w_m$ in weight table 230 have been completed, weight table 230 may be copied or otherwise transferred to LUT 114.

To do so, a suitable memory transfer mechanism may be implemented in update circuit 164 that, in response to an update signal 179 from controller 170, copies the contents of memory table 230 from APD processor 150, or other location in memory system 190 at which weights are stored during calibration, to LUT 114 in PD processor 110. The present invention is not limited to a particular memory scheme or differences in how or where weights are stored during computation versus how and where they are stored for application to data. The skilled artisan will recognize numerous techniques and memory schemes that may be used in conjunction with the present invention without departing from the spirit and intended scope thereof.

For purposes of consistency with the mathematical description provided below, baseband signal BB in FIG. 1 will be referred to as baseband signal x (alternatively as reference signal x), and individual samples of x will be denoted as x(i). The signal provided to APD processor 150 at terminals IQMEI, IQMEQ from IQME processor 140 will be referred to as output signal y (referring to the output of power amplifier 32) and individual samples will be referred to as y(i). Both y(i) and x(i) are complex data words having real and imaginary parts.

Referring again to FIG. 2, samples x(i), representatively illustrated by data point 205 in FIG. 2, may be provided to PD processor 110 and its magnitude $|x(i)|=\sqrt{x_{Re}^2(i)+x_{Im}^2(i)}$ may be computed by, for example, magnitude computation unit 112. Magnitude computation unit 112 may generate an address 212 into memory 210, such as by adding index 222 to a memory base offset 224 at which a weight memory table 230 is located. A predistortion weight $w_m$, representatively illustrated at weight 232 located at address 212 in memory 210, may be provided to predistorter 116, which applies weight 232 to input baseband data word 205, as illustrated by functional block 240. Consequently, input data point 205, which would compel output power corresponding to data point 208 without predistortion, is shifted onto predistorted input curve 203, representatively illustrated at data point 207 and, when amplified by power amplifier 32, produces amplifier output representatively illustrated at data point 209 on PA target output curve 202.

During calibration, x may be a known test signal, such as generated by test signal generator 107 and the magnitude of x may be varied in a known way, such as by a ramp or sawtooth waveform. As stated above, however, the weights $w_m$ are determined iteratively and thus require a number of clock intervals to progress toward convergence. During the time that a particular weight $w_m$ is undergoing computation, a time period referred to herein as weight computation interval, the input signal x need not be static. While, in certain embodiments, a particular sample value of x(i) may be held constant over the weight computation interval, the signal x may continue to vary as needed (or as dictated by the waveform generated by test signal generator 107). When so embodied, computation of weights $w_m$ is not confined to a sequence, i.e., from $w_0$ to $w_{M-1}$, but rather each weight $w_m$ may be computed when a particular value of x is encountered. Consequently, several periods of a test signal waveform, e.g., a sawtooth waveform, may be required before a sufficient number of x magnitude values have landed in each partition, or bin, for which respective weights $w_m$ are assigned before convergence to a solution for each weight $w_m$ can be obtained. The decoupling of which weight is selected for calibration from a prescribed order thereof allows for adaptive predistortion calibration to be performed while communication device 10 is being used for communication using the output of MODEM 105 as the source of reference signal x. By way of such an adaptive predistortion technique, new predistortion weights may be computed as needed in view of various factors, such as temperature of power amplifier 32. That is, as communication device 10 is used and the temperature of power amplifier 32 rises accordingly, a calibration procedure may be initiated to compute weights $w_m$ for the increased temperature and the computed weights may be stored in LUT 114. When communication device 10 is used less, such as when the device's user is asleep, another calibration procedure may be initiated to compute weights for the cooler temperature. Alternatively, default weights, e.g., those determined in the initial factory calibration procedure, may be reloaded into LUT 114, such as by a LDINITWEIGHT signal 177 generated by controller 170.

Referring once again to FIG. 1, a feedback path may be provided from the output of transmitter circuit path 12 to the calibration circuitry of DFE 100, e.g., IQME processor 140 and APD processor 150. In certain embodiments, finite transmitter port/receiver port isolation in T/R switch 34 is leveraged for this purpose. That is, a small but non-zero portion of transmitter signal TxO applied to transmitter port Tx of T/R switch 34 appears at receiver port Rx of T/R switch 34 and that portion is provided to circuitry of DFE 100 that is used for calibration procedures. Other feedback mechanisms can be used with the present invention without departing from the spirit and intended scope thereof, as will be readily recognized by the skilled artisan upon review of this disclosure.

In conventional implementations of communication device 10, power is removed from various circuits in receiver circuit path 14 when data are being transmitted by power amplifier 32. However, in embodiments of the present invention, certain portions of such circuitry in receiver circuit path 14 may be required for calibration purposes, as will be discussed further below, and thus remain energized. Accordingly, controller 170 may provide one or more signals, representatively illustrated by predistortion weight computation (PDWC) control signal 192, to relevant portions of transceiver 20 to accommodate conveyance of the transmitter signal to the calibration circuitry. For example, PDWC signal 192 may compel power to be provided to relevant receiver circuitry (where during non-calibration periods, power would normally be removed) by way of receiver power bypass circuit 22. In certain embodiments, when the receiver is not used for calibration (or for communications), clocks to the receiver digital circuits, representatively illustrated as RCLK 155, can be compelled into a low activity mode to minimize energy consumption. PDWC signal 192 may also compel one or more filters to be bypassed, such as by a filter bypass circuit 24, so as to prevent attenuation of the received signal by transmitter-specific filters during calibration procedures. Additionally, PDWC signal 192 may modify programmable gain amplifiers (PGAs) in transceiver 20, such as by a gain control circuit 26, to accommodate signal levels of the transmitted signal fed back through T/R switch 34. In certain embodiments, an automatic gain control (AGC) circuit may be implemented, in which case additional gain control circuit 26 may not be required. However, in other embodiments, AGC circuits may implement separate gain control processes for communication and calibration, in which case PDWC signal 192 may be used to control the gain in the different processes.

It is to be noted that Eq. (4) assumes that X is input directly into power amplifier 32 and Y is taken directly from the output of power amplifier 32. However, the signals X and Y may not be measured or otherwise obtained at power amplifier 32, but rather at another point, such as at APD processor 150. Thus, compensation for circuit-specific effects other than power amplifier distortion may be applied, e.g., by way of compensation processor 120 in transmitter circuit path 12 and IQME processor 140 in DFE 100, so that the values for x and y at APD processor 150 are as near to those same values of x and y at power amplifier 32 as practicable. Lingering uncompensated signal artifacts may have a detrimental effect on predistortion weight calculation, such as by causing the weight to reflect distortion not imparted by power amplifier 32 and thus not inversely counteracted in power amplifier 32.

According to one PD calibration procedure, controller 170 generates a calibration (CAL) signal 101 and provides such to calibration switch 109. Additionally, controller 170 may generate PDWC signal 192 and provide such to transceiver 20 in accordance with which the necessary receiver components in transceiver 20 are configured for purposes of calibration. In this configuration, a test signal T=TI+jTQ generated by test signal generator 107 may be provided to receiver circuit path 12 as baseband signal x (or BB). Test signal T traverses transmitter circuit path 12, over which the test signal is compensated for various artifacts, as described above, with the possible exception of performing predistortion, such as if LUT 114 has yet to be populated. That is, if the calibration process being performed is an initial calibration process, PD processor 110 may have no weights with which to predistort data provided thereto. In certain embodiments, LUT 114 may be initially populated with unit data, e.g., 1+j0, (for multiplicative application of weights $w_m$) or zero data, e.g., 0+j0 (for additive application of weights $w_m$), for all entries and such is applied to the test data for initial calibration.

Test signal T may proceed from transmitter circuit path 12, through T/R switch 34, LNA 36, receiver circuits (e.g., downconversion circuits) in transceiver circuit 20, loopback switch 111 and provided to IQME processor 140. Thus, signal RD=RDI+jRDQ at the input of IQME processor 170 is distorted commensurately with the power level of power amplitude 32 minus distortion compensation by whatever predistortion may have been performed by PD processor 110, such as by previously computed and currently potentially inaccurate weights stored in LUT 114. IQME processor 140 may compute separate IQMC data for transmitter circuit path 12 and receiver circuit path 14; the transmitter IQMC data TCI, TCQ may be provided to transmitter compensation processor 120 and the receiver IQMC data RCI, RCQ may be provided to IQMC processor 166. In the process of determining these IQMC data, IQME processor 170 may itself apply one or both of transmitter IQMC data TCI, TCQ and receiver IQMC data RCI, RCQ to incoming signal RD and the compensated data are provided to APD processor 150 as signal y.

Meanwhile, the baseband signal x is provided to APD processor 150 as a reference signal at terminals REFI and REFQ. In certain embodiments, baseband signal x is first passed through a delay component 162 that imparts a delay of a duration established by an alignment (ALIGN) signal 178 generated by controller 170. The delay imposed on x by delay component 162 serves to temporally align samples x(i) with samples y(i) are derived from x(i). In so doing, complex division in APD processor 150 is assured to accurately reflect the complex gain $G_D(i)$.

Figure 3:
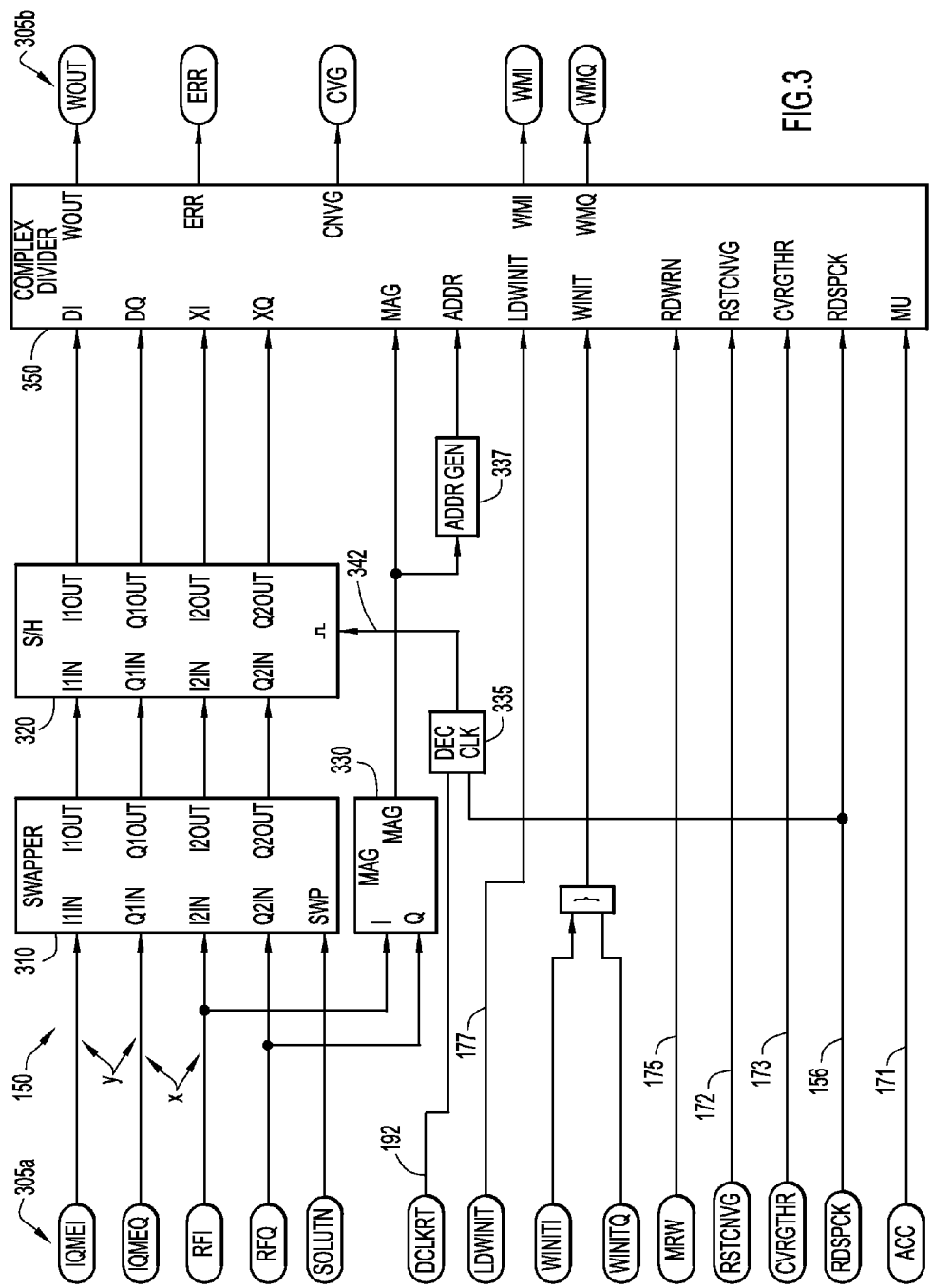
FIG. 3 is a schematic block diagram of an example adaptive predistortion processor by which the present general inventive concept may be embodied.

FIG. 3 is a schematic block diagram of an exemplary APD processor 150 by which the present invention can be embodied. Principally, but not solely, exemplary APD processor 150 comprises a complex divider 350, a sample and hold (S/H) circuit 320, a numerator/denominator swapper 310, a magnitude computation component 330, a decimation clock 335 and an address generator 337. The interface to APD processor 150 generally illustrated at 305a and 305b, representatively referred to herein as interface 305, is labeled with terminal names that correspond with like-named terminals in FIG. 1. APD processor 150 may be implemented in fixed and/or programmable digital logic circuits including programmable gate arrays, application specific integrated circuits, microcontrollers, microprocessors, digital signal processors and other circuitry as needed.

As illustrated in FIG. 3, potentially distorted and possibly compensated data words y(i) received from transmitter circuit path 12 are provided to respective terminals of swapper 310. Undistorted reference data words x(i) are provided to another set of terminals of swapper 310. Controller 150 may generate and provide a solution selection (SOLUTNSEL) signal 176 to the solution (SOLUTN) terminal of APD 150 and, by way of the characteristics of solution selection signal 176, may compel a swap between the numerator and denominator in complex divider 350. In one mode, swapper 310 provides the data words to complex divider 350 so that y(i)/x(i) is computed, and, in the other mode, x(i) and y(i) are swapped so that complex divider 350 computes x(i)/y(i). The complex ratio y(i)/x(i) computes the complex gain $G_D(i)$ of power amplifier 32 (when y(i) has been compensated for other circuitry-introduced anomalies) and the complex ratio x(i)/y(i) computes $G_D^{-1}(i)$ or, equivalently, $w_m(i)$, i.e., the weight that must be applied to x(i) for predistortion. Output signal sample y(i) and reference signal x(i), either swapped or not swapped, are provided to S/H circuit 320, which captures those samples and retains them throughout a weight computation interval. To that end, S/H circuit 320 may latch samples x(i) and y(i) provided at its input in accordance with clock signal 342 of decimation clock 335. That is, a particular set of samples x(i) and y(i) are captured when decimation clock signal 342 transitions into a particular state and the captured samples are held in storage, e.g., registers in S/H circuit 320, until decimation clock signal 342 transitions into that same state one period later, which corresponds to a weight computation interval. At that time, a new set of samples x(i) and y(i) are captured by S/H circuit 320.

As illustrated in FIG. 3, decimation clock 335 may derive its clock signal 342 from that of the receiver DSP clock (RDSPCK) signal 156, such as by clock signal division from receiver clocks 155. The number of clock signal periods of the receiver DSP clock signal 156 that elapse for every clock signal period of decimation clock signal 342 may be established by controller 150 through set decimation clock rate (SETDCLKRT) control signal 192 provided to the DCLKRT terminal of APD processor 150. Other embodiments may provide RDSPCK signal 156 to S/H circuit 320 and utilize a faster clock generator in complex divider 350 to control the weight computation iterations. The skilled artisan will recognize numerous different timing configurations that can be used in conjunction with the present invention without departing from the spirit and intended scope thereof.

Figure 4:
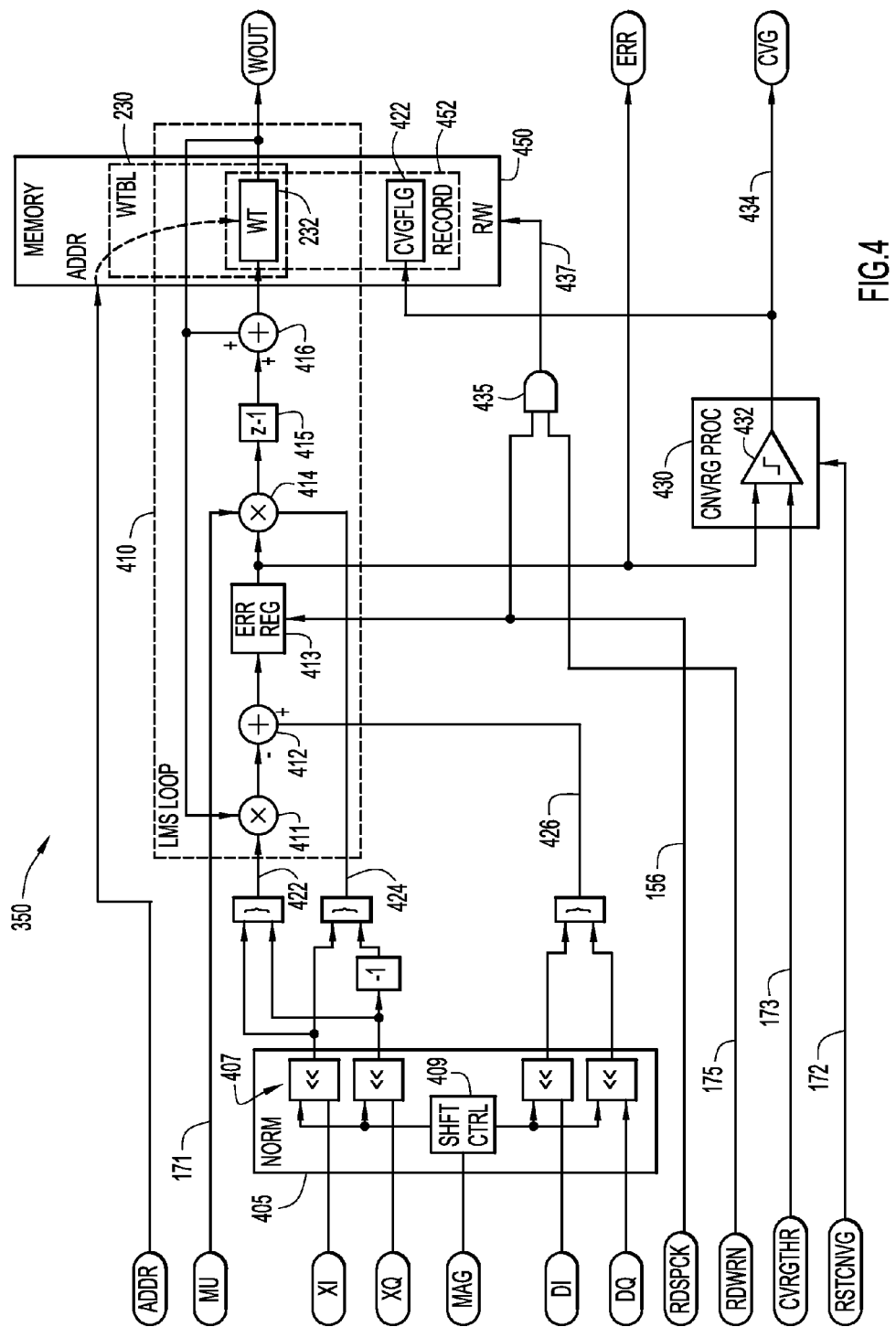
FIG. 4 is a schematic block diagram of an example processor that produces an estimate of complex division in accordance with the present general inventive concept.

Magnitude computation unit 330 may be similar to magnitude computation unit 112 in PD processor 110. Indeed, in certain embodiments, the magnitude of x(i) is computed by a single magnitude computation unit and the computed magnitude value is shared between PD processor 110 and APD processor 150. In other embodiments, however, magnitude computation unit 112 provides an address into LUT 114 based on the magnitude of x(i), but does not provide the magnitude value at its output, since such is generally not used directly in predistortion compensation. On the other hand, magnitude computation unit 330 outputs the value of |x(i)| and provides such to both complex divider 350 and address generator 337. That is, |x(i)| is used to generate the address 212 into memory table 230, as described above with reference to FIG. 2, as well as to compel certain behavior in complex divider 350, as will be described below FIG. 4 is a schematic block diagram of an exemplary complex divider 350. Complex divider 350 may be implemented in fixed and/or programmable digital logic circuits including programmable gate arrays, application specific integrated circuits, microcontrollers, microprocessors, digital signal processors and other circuitry as needed. Complex divider 350 may implement iterative computation to determine the predistortion weights $w_m$ maintained in weight table 230. Since each weight $w_m$ is iteratively computed from a set of input samples, x(i) and y(i), the set of input samples preferably remains constant during the interval over which iterations are performed, i.e., over the weight computation interval. As indicated in the description of FIG. 3, APD processor 150 may establish split timing, where one relatively slower timing branch established by, for example, decimation clock 335 captures input data for the selected weight computation interval and another relatively faster timing branch established by, for example, the receiver DSP clock sets the iteration timing.

In certain embodiments, such as that illustrated in FIG. 4, complex divider 350 implements a least mean squares (LMS) loop 410. Over a given weight computation interval T, defined in the instant example as one period of decimation clock signal 342, a sample of reference signal x(i) and a sample of output signal y(i) are captured by S/H circuit 320. For clarity, the values stored in S/H circuit 320 will be denoted herein as x(T) and y(T), respectively. Additionally, the complex conjugate of x(T), i.e., x*(T) is computed and x(T), x*(T) and y(T) are distributed by signal paths 422, 424 and 426, respectively. For each period of receiver DSP clock signal 156, denoted herein as n, an updated value of a complex factor z(n+1) is produced in LMS loop 410. Complex factor z(n) is one of complex gain $G_D$ and weight $w_m$ depending on whether a numerator/denominator swap was performed in swapper 310. The output of multiplier 411 is z(n)x(T), which is provided to summer 412, by which error e(n)=y(T)−z(n)x(T) is computed and stored in error register 413. The error in error register 413 is multiplied by both an adaptation factor μ and x*(T) in multiplier 414, and the resulting term, μe(n)x*(T) is delayed by unit delay component 415. The output of summer 416 is z(n)+μe(n−1)x*(T), and the corresponding weight $w_m$(n) (either directly when z(n)=$w_m$(n) is computed or after an inversion when z(n), $G_D$(n) is computed) is stored in weight table 230 as weight 232 at the address 212 in memory 450 computed by address generator 337 from the magnitude of x. The skilled artisan will recognize the operations of LMS loop 410 as implementing an LMS iterative scheme comprising an error computation, i.e., $$e(n)=y(T)-z(n)x(T), \qquad (8)$$

at the output of summer 412 and an update computation, i.e., $$z(n+1)=z(n)+\mu e(n)x^*(T). \qquad (9)$$

The solution is found by iteratively assigning values to the complex factor z(n) in a manner by which z(n)x(T) converges to y(T) with each iteration n. The ordinarily skilled artisan will recognize a number of different techniques by which such iterative assignment can be realized, the LMS technique being just one example. In alternative embodiments, LMS loop 410 may be modified to implement the update computation as z(n+1)=z(n)+μe*(n)x(T). In the LMS technique, as e(n) is driven to zero, y(T)−z(n)x(T)=0, which corresponds to Eq. (6).

Figure 5:
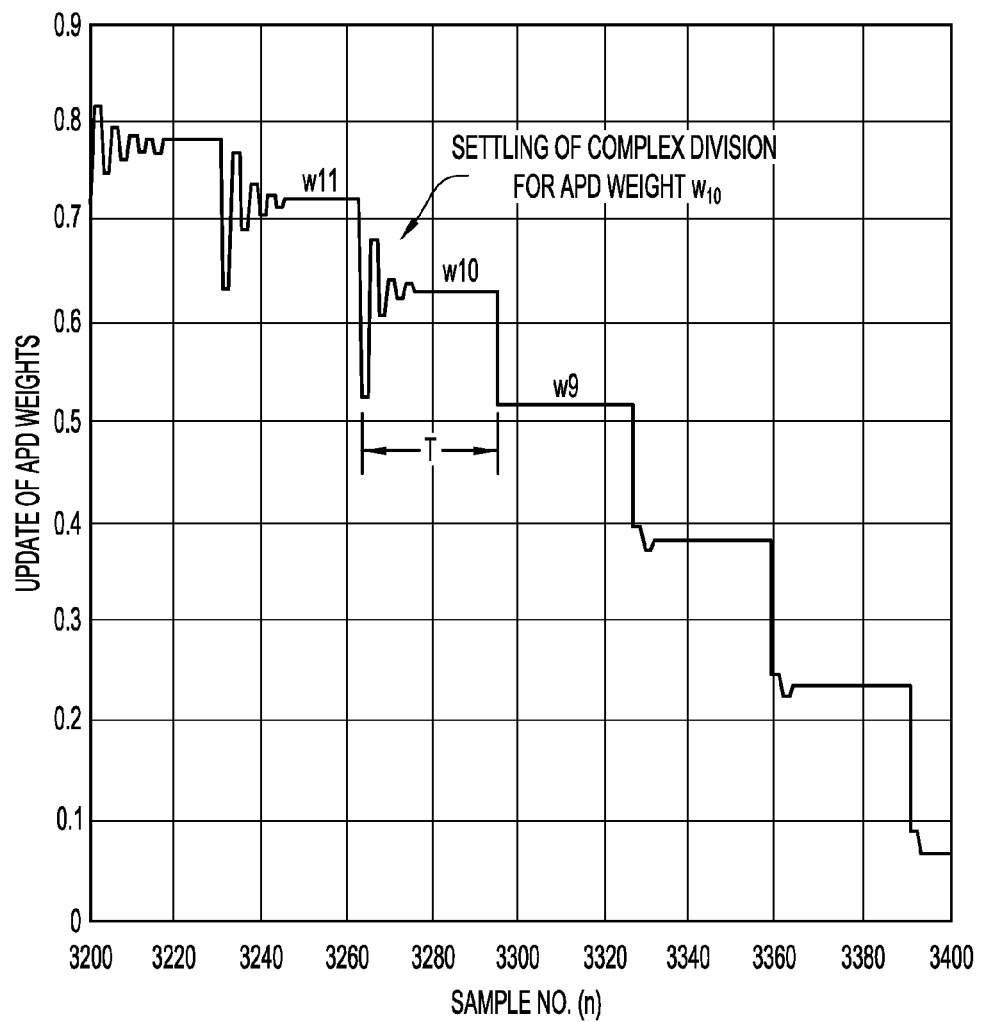
FIG. 5 is a graph illustrating convergence behavior for predistortion weights generated in accordance with the present general inventive concept.

It is to be understood that the present invention does not require error e(n) to be stored in a register 413 or that a unit delay be imposed by a unit delay component 415. Traversal of values to different functional elements in LMS loop 410 may be achieved by prudent selection of timing signals. For example, read/write operations in memory 430 may be commanded by memory read/write (MRW) signal 175 from controller 170, which may be synchronized with receiver DSP clock signal 156 by a suitable gate 435. When so configured, a memory write operation by which an updated weight w(n+1) at the output of summer 416 is stored in weight table 230 may be forced to occur in response to timing of receiver DSP clock signal 156 that is 180° out of phase with timing of the error computation at the output of summer 413. Nevertheless, error register 413 is illustrated in FIG. 4 for purposes of explanation, particularly with regard to transitions that occur when new samples for x(T), x*(T) and y(T) are captured by S/H circuit 320 and, concurrently, a new weight 232 is addressed by address generator 337. When this occurs, the value of e(n) stored in LMS loop 410, such as in error register 413, at whatever state of convergence toward zero the error e(n) happens to be at the time, is applied in the weight update computation, e.g., Eq. (8), thereby introducing, at least in initial iterations of the new weight computation interval, a potentially sharp increase in the error value once the error computation, e.g., Eq. (9), is performed. Consequently, e(n) may initially oscillate about zero in early iterations of the weight computation interval, which will of course manifest itself as a corresponding oscillation in the weight updated computation as such converges towards its final value. Such oscillation or ringing can be seen in FIG. 5.

Convergence on a solution of complex division by LMS loop 410 may be evaluated at each iteration by convergence processor 430. In certain embodiments, convergence processor 430 compares the error signal e(n) with one or more convergence thresholds established by controller 170 by convergence threshold (CVRGTHRESH) signal 173. To that end, convergence processor 430 may implement a comparator, either in hardware or in a combination of hardware and software, that produces a known signal level at its output, representatively illustrated by convergence (CVG) signal 434, when the threshold condition has been met. In one embodiment, a convergence threshold signal 173 may be generated suitably close to zero, in which case any residual error e(n) in the complex division estimate will have only tolerable impact on the predistortion weight(s). Convergence signal 173 may be provided to controller 170 as convergence reached (CNVRGREACHED) signal 174, in response to which controller 170 may take some action. In one embodiment, convergence on a solution as indicated by convergence reached signal 174 may compel controller 170 to terminate the current weight computation interval regardless of any remaining time allotted thereto by decimation clock 335. Additionally, controller 170 may reset convergence processor 430 by generating and applying a convergence processor reset (RESETCVGPROC) signal 172, by which convergence processor 430 is returned to a reset state that includes resetting convergence reached signal 174.

As illustrated in FIG. 4, once a solution for a particular weight has been found, i.e., LMS loop 410 has converged upon a solution for complex factor z(n) to within a tolerable error, an indication of such may be stored in memory 450 (or elsewhere in memory system 190), such as by way of a Boolean convergence flag (CVGFLG) 422 stored in a record 452 associated with weight 232. In certain embodiments, each weight 232 has an associated convergence flag 422 that is set when that weight 232 has been found to meet the established convergence criteria. It is to be understood that such convergence flag(s) 452 need not be stored in the same memory space as memory table 250; record 452 is an abstraction that represents any storage association by which a convergence flag 452 for a corresponding weight 232 can be located for evaluating its state, regardless of its physical location in memory system 190.

As illustrated above, weight update computation by Eq. (9) may be influenced by an adaptation factor μ, such as to control the step size in the convergence. A larger step size may result in faster convergence, but may also carry with it a large mean-square error (MSE) once convergence has been reached (steady-state). Conversely, a smaller step size corresponding to a relatively smaller μ may require a longer time for convergence, but the steady-state MSE is relatively smaller than when the larger is μ used. Thus, a balance between convergence rate and steady-state MSE is typically struck when choosing a value for the adaptation factor μ.

In certain embodiments, adaptation factor μ is variable, even within a given weight computation interval. That is, during a weight computation interval for a given weight, adaptation factor μ starts at some relatively large value and decreases incrementally at predetermined times during the weight computation interval. The present invention is not limited to the timing of the incremental decreases or to the amount that μ is decreased with each incremental change. In certain embodiments, these factors are determined experimentally.

APD processor 150 may include a normalization processor 405 to increase the convergence rate when |x| is a small number. To demonstrate, graph 200 in FIG. 2 has been divided into a plurality of regions, R0-R3, each of which spanning portions of PA actual output curve 201. In region R0, it is to be noted that |x| is small while at the same time power amplifier curve 201 is substantial linear and coincident with desired linear response curve 202. In region R1, power curve 201 and linear curve 202 begin to separate and |x| is slightly larger. This trend continues through region R3, where |x| obtains its maximum values and actual power curve 201 is at maximum deviation from the desired linear behavior represented by curve 202. It is to be understood that while four regions R0-R3 are illustrated in FIG. 2, the present invention is not so limited; a greater number or fewer regions may be established without deviating from the spirit and intended scope of the present invention.

When |x| is small, the number of bits in the one (1) state is small and those bits are confined to the least significant bits of transmitter circuit path 12. Consequently, there is substantially greater quantization noise in region R0 than in R2 or R3. Additionally, the fact that the power in signal sample y(i) is small and the reference signal x(i) is also small hinders convergence at least with respect to the time allotted for such. At the same time, those regions in which |x| is small coincide with substantially linear response of power amplifier 32. Normalization processor 405 increases the number of bits by left-shifting y(T) and x(T) by the same amount. In certain embodiments, normalization processor 405 includes a shift controller 409 and a set of shift registers 407. Shift controller 409 receives the magnitude of x(T) from magnitude computation unit 330 and shifts y(T) and x(T) based on that magnitude.

The impact of normalization can be observed from the following modified versions of Eqs. (8) and (9):

$$e_s(n)=2^p y(T)-z(n)[2^p x(T)]=2^p e(n), \quad (10)$$

and, $$z(n+1)=z(n)+\mu e_s(n)[2^p x^*(T)]=z(n)+(2^{2i}\mu)e(n)x^*(T). \quad (11)$$

Thus, normalization by normalization processor 405 has the effect of shifting the adaptation factor μ by 2i bits leftward and, accordingly, accelerating the convergence of the solution. The number p is selected in accordance with the magnitude of x and, in certain embodiments, p is set so that the shifted samples occupy the entire data word width of transmitter circuit path 12 except for the most significant bit thereof.

Complex division by embodiments of the present invention can be iteratively performed independently of the data rate at which input data arrives and is transmitted. Accordingly, complex factor computations can be performed on live data, i.e., data modulated by MODEM 105. To carry this out, calibration switch 109 is placed in a normal communication mode that connects MODEM 105 to PD processor 110. Calibration then proceeds in the same manner as described above where a test signal from test signal generator 107 was used as the data source. Whereas prudent selection of a deterministic test signal waveform can ensure that all complex factors are computed in a reasonable amount of time, no such assurance can be assumed when live communication data is used as the calibration signal source, since the magnitude of the input signal is determined by its information content and is not deterministic. And, in certain embodiments, it is only after all weights $w_m$ have been computed that LUT 114 is updated with the newly computed predistortion data. When so embodied, a determination can be made as to whether convergence flag 422 associated with respective weights $w_m$ are set or otherwise indicative that a solution was found for the associated weights to within established converge criteria. In response to this condition, controller 170 may generate PDUPDT signal 179 and may provide such to update processor 164. Accordingly, update processor 164 may transfer the contents of weight table 230 into LUT 114 and PD processor may then utilize the newly transferred predistortion weights $w_m$ for predistortion.

Figure 6:
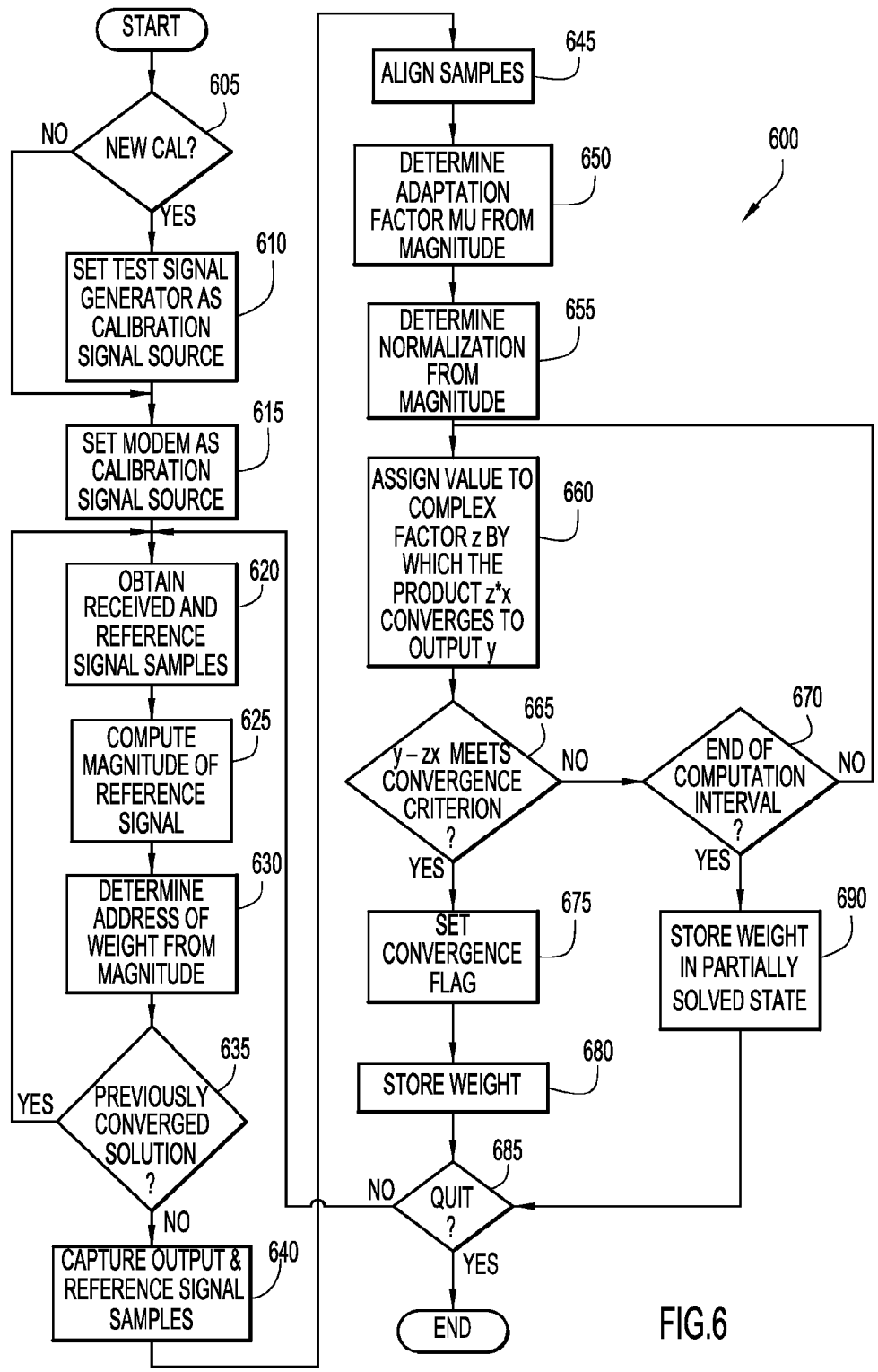
FIG. 6 is a flow diagram of an example predistortion weight computation process in which the present general inventive concept may be embodied.

FIG. 6 is a flow diagram of an exemplary predistortion calibration process 600 that can be implemented by embodiments of the present invention. In operation 605, it is determined whether calibration process 600 is being conducted as initial calibration, e.g., for the first time after manufacture. If process 600 is being performed for initial calibration, test signal generator 107 is established as the calibration signal source in operation 610 and MODEM 105 may be placed into a low power state. If process 600 is being performed for purposes of update using live data and performing complex factor computing as a background process, process 600 may transition to operation 615 in which MODEM 105 is established as the calibration signal source. In operation 620, the calibration signal is processed over transmitter circuit path 12, through T/R switch 34, LNA 36, IQME processor 140 and is obtained by APD processor 150 as output signal y. Reference signal x is also obtained in operation 620. In operation 625, the magnitude of the reference signal is determined, such as by magnitude processor 330, and in operation 630 an address is generated from the magnitude, such as by address generator 337. In operation 635, it is determined whether the complex factor at the computed address is one for which a solution has already converged upon and, if so, process 600 transitions back to operation 620 at which new output and reference samples are obtained.

If the complex factor corresponding to the magnitude computed in operation 625 has not reached convergence, as determined in operation 635, samples of the reference and output signals are captured and held for a predetermined number of clock intervals corresponding to a weight computation interval in operation 640. The reference and output signal samples are then temporally aligned in operation 645, such as by delay component 162. In operation 650, adaptation factor μ is determined from the magnitude computed in operation 625, which indicates the region in which convergence occurs quickly or slowly. In operation 655, the number of shifts for normalization is also determined from the magnitude computed in operation 625. In operations 660, a value is assigned to the complex factor such that the product of the complex factor and the reference signal sample converges toward the output signal sample. Convergence is tested in operation 665. If, as determined in operation 665, convergence has been reached for the current complex factor, a convergence flag is set in operation 675 and the associated predistortion weight is stored in operation 680. If, on the other hand, convergence has not been reached, it is determined in operation 670 whether the end of the computation interval has been reached. If so, the weight is stored in its current state in operation 690, regardless of the lack of a solution being found. If the computation interval is not at end, a next iteration in the computation interval begins at operation 660.

In operation 685, it is determined whether the process is to be terminated and such action is taken in the affirmative case. If predistortion calibration process is to be continued, however, process 600 transitions back to operation 620, where a new set of reference and received signal samples are obtained and the process repeats from that point.

In certain embodiments, a digital loopback path is provided from compensation processor 120 to IQME processor 140 as illustrated in FIG. 1. This allows closed loop digital testing of DFE 100. To utilize the loopback path, controller 170 may generate a built-in self test (BIST) signal 194 and provide BIST signal 194 to loopback switch 111. APD processor 150 can be tested by applying the predistortion weights in LUT 114 to a test signal, such as generated by test signal generator 107, and providing this predistorted signal to ADP processor 150 through IQME processor 140. The undistorted test signal is used as the reference signal in ADP processor 150. The delay in the digital path is deterministic and, hence, delay component 162 can be configured to align the predistorted samples with the reference samples exactly. APD processor 150 may then compute the complex gains by complex division described herein and, given that the distortion on the test signal is by the predistortion weights applied by predistortion processor 110, the complex factors computed by APD processor 150 should converge on the predistortion weights themselves (or complex gains depending on whether the numerator or denominator were swapped by swapper 310. The loopback configuration also allows closed loop verification of IQME processor 170 if a known IQ mismatch is introduced in compensation processor 120. Additionally, the loopback mode allows verification that the ADP technique works within design parameters when live modulation data is used for calibration instead of a slow varying test signal, such as a ramp or a sawtooth wave.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. A method for determining predistortion data for a power amplifier comprising:

generating a baseband signal comprising sequential complex samples generated at a predetermined sample rate to obtain samples of the baseband signal;

capturing one of the samples of the baseband signal and a sample of an output signal generated by the power amplifier from the captured sample of the baseband signal;

assigning, iteratively, complex values to a complex factor such that a product of the captured sample of the baseband signal and the complex factor converges with each iterative assignment towards equivalence to the captured sample of the output signal; and storing, as the predistortion data, the complex factor in a memory at an address associated with a value of the captured sample of the baseband signal.

2. The method of claim 1, wherein assigning the complex values comprises:

assigning a complex value to the complex factor in one iteration based on an error determined in an immediately preceding iteration, the error being determined from a difference between the product of the captured sample of the baseband signal and the complex factor assigned in the previous iteration and the captured sample of the output signal.

3. The method of claim 2 further comprising:

terminating the iterative assigning of the complex values to the complex factor responsive to the error meeting a solution convergence criterion.

4. The method of claim 3, wherein assigning the complex value to the complex factor further comprises:

assigning the complex value to the complex factor in the one iteration based on the error determined in the immediately preceding iteration in accordance with an error computation and an update computation of a least mean squares (LMS) process.

5. The method of claim 3 further comprising:

storing an indication that the solution convergence criterion has been met for the complex factor.

6. The method of claim 5 further comprising:

determining, from the value of the captured sample of the baseband signal, the address in the memory at which the associated complex factor is stored; and omitting the iterative assigning of the complex value to the complex factor upon a determination from the stored indication that the solution convergence criterion has been met for the complex factor at the address.

7. The method of claim 6 further comprising:
retrieving the complex value of the complex factor stored at the address in the memory upon a determination that the solution convergence criterion has not been met for the complex factor at the address; and
assigning the retrieved complex value to the complex factor in an initial iteration of the iterative assignment of the complex values to the complex factor.

8. The method of claim 7 further comprising:
establishing a temporal interval over which a predetermined number of iterations of the iterative assignment of the complex values to the complex factor is performed; and
terminating the iterative assigning of the complex values to the complex factor responsive to the temporal interval elapsing.

9. The method of claim 8 further comprising:
allocating a number of memory locations in which to store a like number of complex factors, the addresses of the memory locations being associated with a range of the values of samples of the baseband signal; and
storing the complex factor in the memory at the address associated with the range of values in which the value of the captured sample of the baseband signal falls.

10. The method of claim 9, wherein allocating the memory locations comprises:
partitioning a dynamic range of the power amplifier into a predetermined number of sub-ranges;
allocating the number of memory locations to be equivalent in number to the sub-ranges; and
associating the memory locations with respective sub-ranges.

11. The method of claim 1, wherein the capturing of the sample of the baseband signal and the sample of the output signal comprises:
capturing of the sample of the baseband signal and the sample of the output signal at a rate less than the predetermined sample rate of the baseband signal.

12. The method of claim 1 further comprising:
normalizing the captured sample of the baseband signal and the captured sample of the output signal such that values of the captured sample of the baseband signal and the captured sample of the output signal are increased by a common multiplier if a magnitude of the captured sample of the baseband signal is less than a threshold magnitude value.

13. An apparatus for determining complex factors for predistorting data for a power amplifier, the apparatus comprising:
a data capture device to capture, at a predetermined sample rate, a sample of a baseband signal and a corresponding sample of an output signal generated by the power amplifier from the captured sample of the baseband signal;
a memory to store complex factors at respective addresses therein associated with values of the captured samples of the baseband signal; and
a complex data processor to compute each complex factor by assigning, iteratively, complex values to the complex factor associated with one of the addresses such that a product of the captured sample of the baseband signal and the complex factor converges with each iterative assignment towards equivalence to the captured sample of the output signal.

14. The apparatus of claim 13, wherein the complex data processor is configured to assign a complex value to the complex factor in one iteration based on an error determined in an immediately preceding iteration, the error being determined from a difference between the product of the captured sample of the baseband signal and the complex factor assigned in the previous iteration and the captured sample of the output signal.

15. The apparatus of claim 14, wherein the complex data processor terminates the iterative assigning of the complex values to the complex factor responsive to the error meeting a solution convergence criterion.

16. The apparatus of claim 15, wherein the complex data processor is further configured to:
determine, from the value of the captured sample of the baseband signal, the address in the memory at which the associated complex factor is stored;
retrieve the complex value of the complex factor stored at the address in the memory upon a determination that the solution convergence criterion has not been met for the complex factor at the address; and
assign the retrieved complex value to the complex factor in an initial iteration of the iterative assigning of the complex values to the complex factor.

17. The apparatus of claim 16 further comprising:
a clock circuit to establish a temporal interval over which a predetermined number of iterations of the iterative assignment of the complex values to the complex factor is performed, wherein the complex data processor terminates the iterative assigning of the complex values to the complex factor responsive to the temporal interval elapsing.

18. The apparatus of claim 17, wherein the clock circuit is coupled to the data capture device to capture the sample of the baseband signal and the sample of the output signal at a rate less than a sample rate of the baseband signal.

19. The apparatus of claim 13 further comprising:
a normalizing processor to normalize the captured sample of the baseband signal and the captured sample of the output signal such that values of the captured sample of the baseband signal and the captured sample of the output signal are increased by a common multiplier if a magnitude of the captured sample of the baseband signal is less than a threshold magnitude value.

20. A tangible, non-transitory computer readable medium having encoded thereon processor instructions that, when executed by a processor, configures the processor to:
accept at a predetermined sample rate a sample of a baseband signal and a sample of an output signal generated by a power amplifier from the sample of the baseband signal;
assign complex values to a complex factor iteratively such that a product of the sample of the baseband signal and the complex factor converges with each iterative assignment towards equivalence to the sample of the output signal; and
store the complex factor in a memory at an address associated with a value of the sample of the baseband signal.

* * * * *